(12) United States Patent
Kim

(10) Patent No.: US 6,777,345 B2
(45) Date of Patent: Aug. 17, 2004

(54) PATTERNING METHODS FOR FABRICATING SEMICONDUCTOR DEVICES

(75) Inventor: Young-Dae Kim, Seoul (KR)

(73) Assignee: Samsung Electronics Co., Ltd. (KR)

(*) Notice: Subject to any disclaimer, the term of this patent is extended or adjusted under 35 U.S.C. 154(b) by 21 days.

(21) Appl. No.: 10/350,619

(22) Filed: Jan. 24, 2003

(65) Prior Publication Data

US 2003/0143859 A1 Jul. 31, 2003

(30) Foreign Application Priority Data

Jan. 28, 2002 (KR) .............................. 10-2002-0004779

(51) Int. Cl.[7] .............................................. H01L 21/31
(52) U.S. Cl. ...................................... 438/758; 438/734
(58) Field of Search ................................ 438/758, 734

(56) References Cited

U.S. PATENT DOCUMENTS 6,351,304 B1 * 2/2002 Kawashima et al. ............ 355/55
6,497,992 B1 * 12/2002 Yunogami et al. .............. 430/313
6,605,395 B2 * 8/2003 Grobman et al. .................. 430/5
6,624,078 B1 * 9/2003 Ravkin .............................. 438/692
6,706,200 B2 * 3/2004 Moon et al. ........................ 216/2

* cited by examiner

Primary Examiner—John F. Niebling
Assistant Examiner—Olivia T. Luk
(74) Attorney, Agent, or Firm—F. Chau & Associates LLC (57) ABSTRACT

A method for fabricating a semiconductor device comprises forming a material layer on a wafer having a plurality of independent pattering regions, and patterning the material layer to form a material pattern. The material layer is patterned such that the material patterns have different line widths in a plurality of the independent patterning regions. Pattering the material layer comprises a plurality of photolithographic processes or a plurality of etching processes, which are separately applied to each of the patterning regions. The photolithographic processes are preferably applied to each of the independent pattering regions using different reticles. The reticles have different line widths and circuit patterns of the same design. The etching processes are preferably applied to each of the independent pattering regions using different etch recipes.

22 Claims, 7 Drawing Sheets

PATTERNING METHODS FOR FABRICATING SEMICONDUCTOR DEVICES

This application claims the benefit of Korean Patent Application No. 2002-04779, filed on Jan. 28, 2002.

BACKGROUND OF THE INVENTION

1. Field of the Invention

The present invention relates to methods of fabricating semiconductor devices and, more particularly, to patterning methods for fabricating semiconductor devices including a multiple photolithographic process.

2. Discussion of Related Art

Fabrication processes of semiconductor devices can include an ion implantation process for implanting impurities into a semiconductor substrate, a deposition process for forming a material layer, a thermal process for heat-treating at a high temperature, and photolithographic/etching processes for patterning a material layer. However, in the fabrication processes of the semiconductor devices, a process deviation, which represents a degree of variation of process results according to a position on a wafer or to an order of wafers, can be generated. Process deviation can be an important factor in limiting the yield of the semiconductor devices with higher integration semiconductor devices and increased wafer size.

Figure 1A:
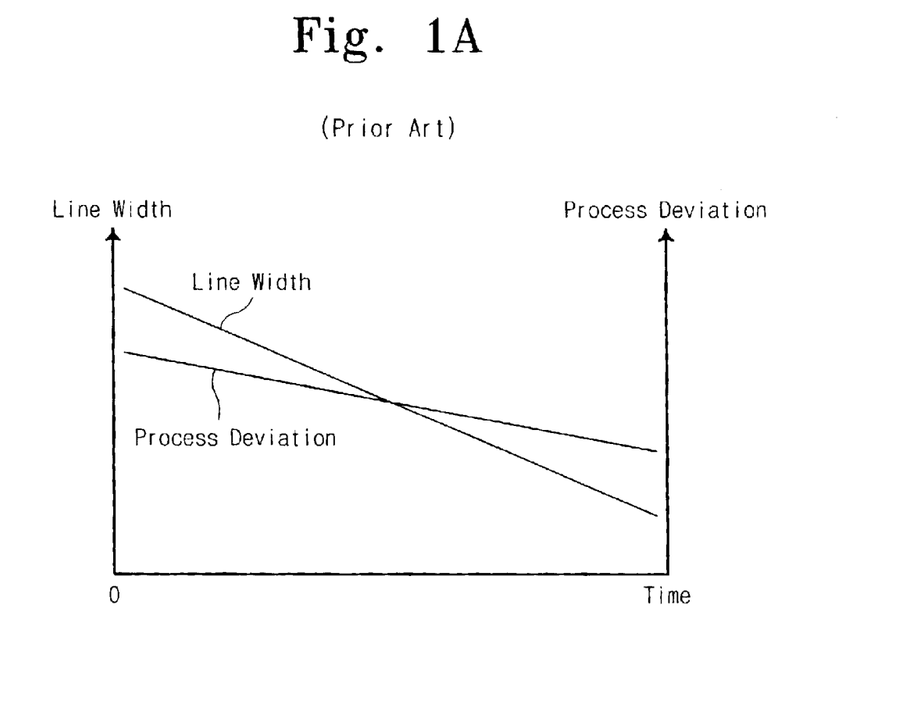
FIGS. 1A and 1B are graphs illustrating problems caused by a difference in a decrease rate between a line width and a process deviation of semiconductor devices.
Figure 1B:
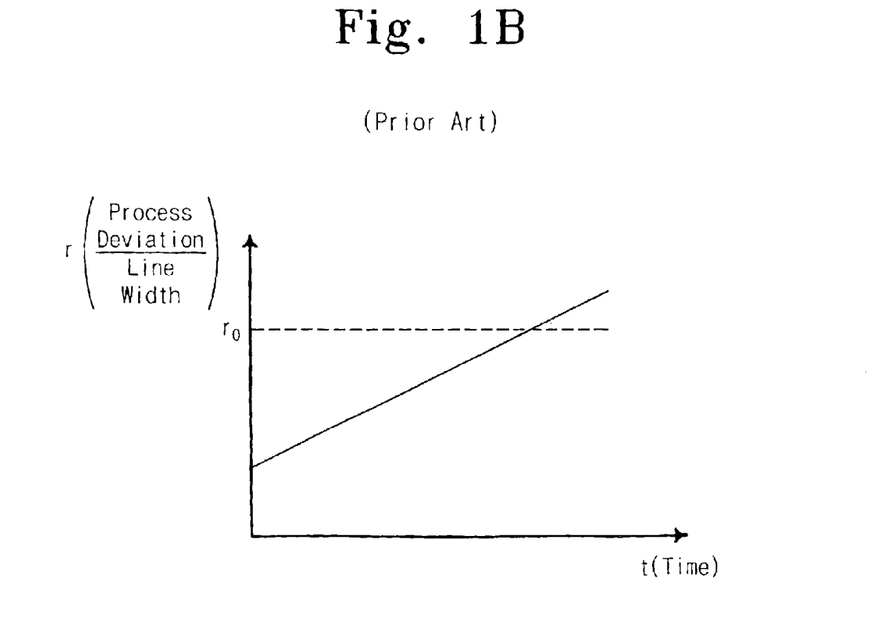

FIGS. 1A and 1B are diagrams illustrating an influence of a process deviation on characteristics of semiconductor devices. FIG. 1A illustrates comparisons between a line width and a process deviation. FIG. 1B illustrates a ratio of process deviations to line widths for semiconductor devices.

Due to an industrial need for high integration, techniques for reducing a line width and process deviation have been developed. However, as illustrated in FIGS. 1A and 1B, line width has decreased at a greater rate than process deviation.

A process deviation effect r, which represents an influence of the process deviation on characteristics of semiconductor devices, may result in the deterioration of products. The process deviation effect r has increased with time (FIG. 1B), due to the difference in the rates of advancement for process deviation and line width. The process deviation effect r becomes a design issue that needs to be addressed below a critical process deviation effect $r_0$, and thus needs to be considered when designing the characteristics of semiconductor devices. Further, as highly integrated and reliable semiconductor devices have been required, the critical process deviation effect $r_0$ grows smaller.

Figure 2A:
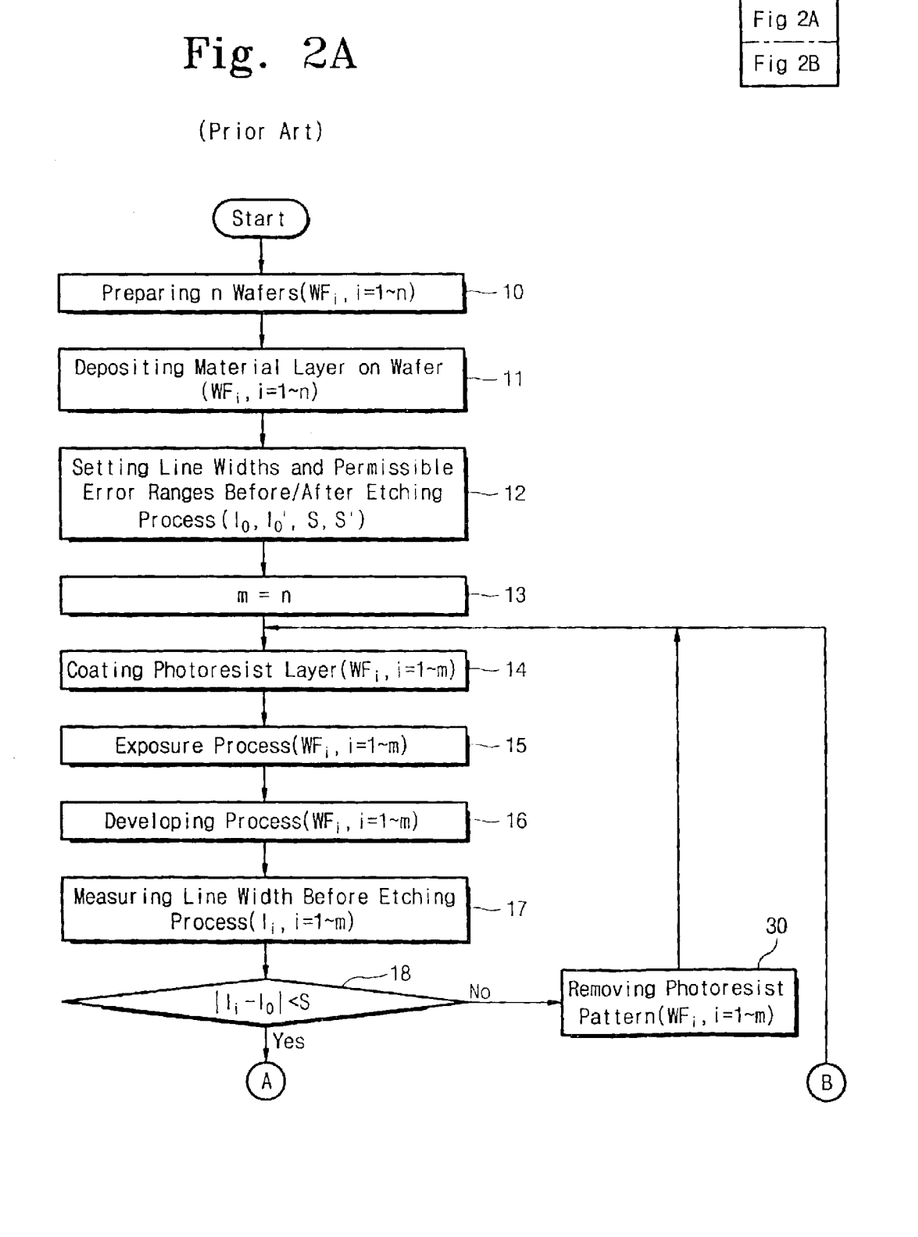
FIG. 2 is a process flowchart illustrating a conventional patterning method for fabricating a semiconductor device.
Figure 2B:
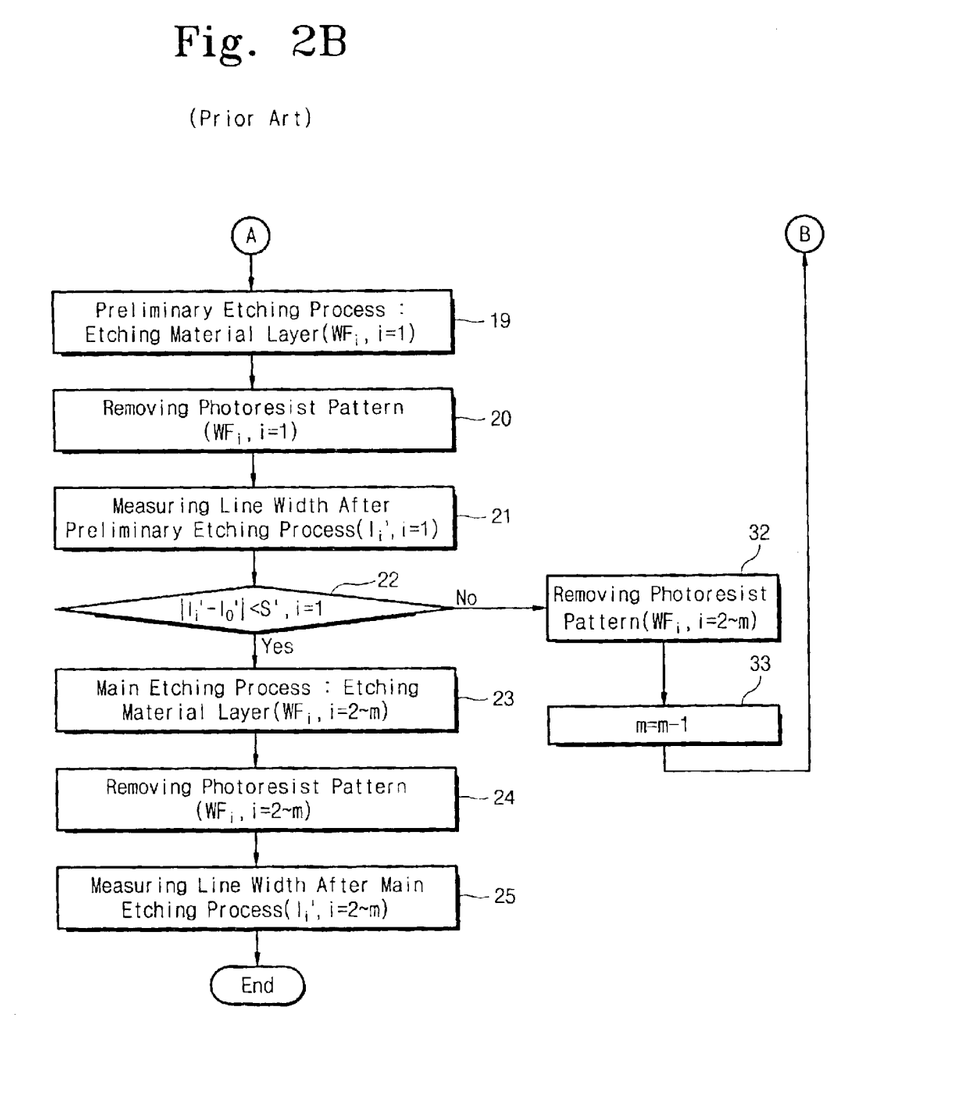

FIG. 2 is a process flowchart illustrating a conventional patterning method for fabricating a semiconductor device.

Referring to FIG. 2, after preparing n wafers (10), a material layer is deposited on the wafers (11). Process conditions for patterning the material layer are set (12). That is, target line widths ($1_0$, $1'_0$) and permissible error ranges (S, S') for the patterning process are set. $1_0$ and S are target values for an inspection step 18 to be performed after a photolithographic process and before an etching process. $1'_0$ and S' are target values for an inspection step 22 to be performed after the etching process.

A surface of each semiconductor substrate is coated with a photoresist layer where the material layer is formed (13, 14). After undergoing exposure and developing processes to form a photoresist pattern (15, 16), a line width 1 of the photoresist pattern is measured (17). The line width is compared to the permissible error range (18) before the etching process (19). The semiconductor substrates are repeatedly coated and etched (13–18) until a difference between the measured line width 1 and the target line width $1_0$ of the photoresist pattern does not depart from the permissible error range S (18).

When the line width 1 of the photoresist pattern is within the permissible error range (e.g., $|1-1_0|<S$), a preliminary etching process 19 is carried out using the photoresist pattern as an etch mask to form a material pattern. At this time, the preliminary etching process 19 can be applied to one wafer ($WF_i$, i=1) selected from the wafers. After removing the photoresist pattern 20 from the wafer ($WF_i$, i=1), a line width ($1'_i$, i=1) of the material pattern can be measured (21).

When a difference between the measured line width $1'_1$ and the target line width $1'_i$ of the material pattern is within the permissible error range S, a main etching process (23) is applied to the remaining wafers. At this time, the main etching process 23 is conducted under the same process conditions as the preliminary etching process. As a result, the material layer is etched to form a material pattern. The photoresist pattern is removed to uncover the material pattern (24), and a line width $1'_i$ of the uncovered material pattern is then measured (25).

If the line width $1'_1$ of the material pattern that is measured during the preliminary etching process 19 is not within the permissible error range (e.g., $|1'-1'_0|>S'$), the photoresist pattern is removed (32, 33) and step 14 (i.e., coating the photoresist layer) through step 22 (i.e., comparing a line width) are repeatedly performed.

As mentioned above, when the line width measured in the comparing step (18, 33) before/after the preliminary etching process 19 departs from the permissible error range, unfavorable rework processes (30, 32, and 33) need to be performed. As illustrated in FIGS. 1A and 1B, as an influence of the process deviation on characteristics of the semiconductor devices increases, the line widths measured before/after the etching process can become increasingly different. Thus, the number of rework processes (30, 32, and 33) increases, adding to fabrication costs.

Although problems of the patterning process are explained in relation to a process deviation of a line width by FIG. 2, the process deviation may occur during a thermal process and an ion implantation process. That is, characteristics of impurity regions used for source/drain regions of transistors are varied according to positions in wafers, due to process deviations of the thermal process and the ion implantation process. The characteristic of the impurity region is an important variable for determining product characteristics of semiconductor devices. Accordingly, the process deviation may cause deterioration of the semiconductor devices. In particular, as illustrated in FIGS. 1A and 1B, with a high integration of semiconductor devices, as trends progress the process deviation will surpass the critical process deviation effect $r_0$.

Therefore, a need exists for methods for preventing or correcting deterioration of products caused by the process deviation.

SUMMARY OF THE INVENTION

It is therefore a feature of the present invention to provide a method for fabricating a semiconductor device that enables compensation for a process deviation.

It is another feature of the present invention to provide a method for fabricating a semiconductor device that may minimize rework processes during a patterning process.

In accordance with an aspect of the present invention, there is provided a patterning method for fabricating a semiconductor device comprising performing a photolithographic process at least twice in one processing step. The method comprises preparing a wafer having a plurality of independent patterning regions. After forming a predetermined material layer on the wafer, the material layer is patterned to form a material pattern. The patterning process is carried out such that the material patterns have different line widths at a plurality of the independent patterning regions.

Patterning the material layer preferably comprises performing a plurality of photolithographic processes, which are separately applied to each patterning region. At this time, a plurality of the photolithographic processes are preferably applied to each independent patterning region using different reticles. It is also preferable that the reticles have different line widths and identical circuit pattern designs.

Patterning the material layer preferably comprises a plurality of etching processes, which are separately applied to each of the patterning regions. At this time, a plurality of the etching processes are preferably applied to each of the independent patterning regions using different etch recipes.

A loop process including the photolithographic and etching processes may be applied to one patterning region after another.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

As mentioned above, the process deviation caused by the ion implantation process and the thermal process can change the characteristics of an impurity region of a transistor, e.g., a source/drain region. In addition, the source/drain region of the transistor can be formed by using a gate electrode as an ion implantation mask. Thus, a distance between the source/drain regions is varied according to a width of the gate electrode. In this case, the distance between the source/drain regions may be another variable characteristic of the semiconductor device. As a result, by adjusting a width of the gate electrode, it is possible to compensate for a change in characteristics of the impurity region caused by the process deviation of the thermal process and the ion implantation process.

According to an embodiment of the present invention, by adjusting a line width of the material pattern using the reticle a technical limit of integration can be realized. To use the identical reticle for reproducibility, it is preferable to set a permissible error range to 10% of a designed line width. However, variations in line width can depart from the permissible error range according to the integration of the semiconductor devices (e.g., integration not at the technical limit). At this time, it is ideal to use another reticle. If different reticles are used for a process step, a photolithographic process for a patterning process should include a plurality of exposure steps.

Further, rework processes for a patterning process are carried out to overcome a line width deviation according to variations in the positions of wafers. As the integration of semiconductor devices increases, the rework processes becomes less effective for dealing with the line width deviation. Accordingly, multiple photolithographic processes is preferable.

Figures 3, 3A:
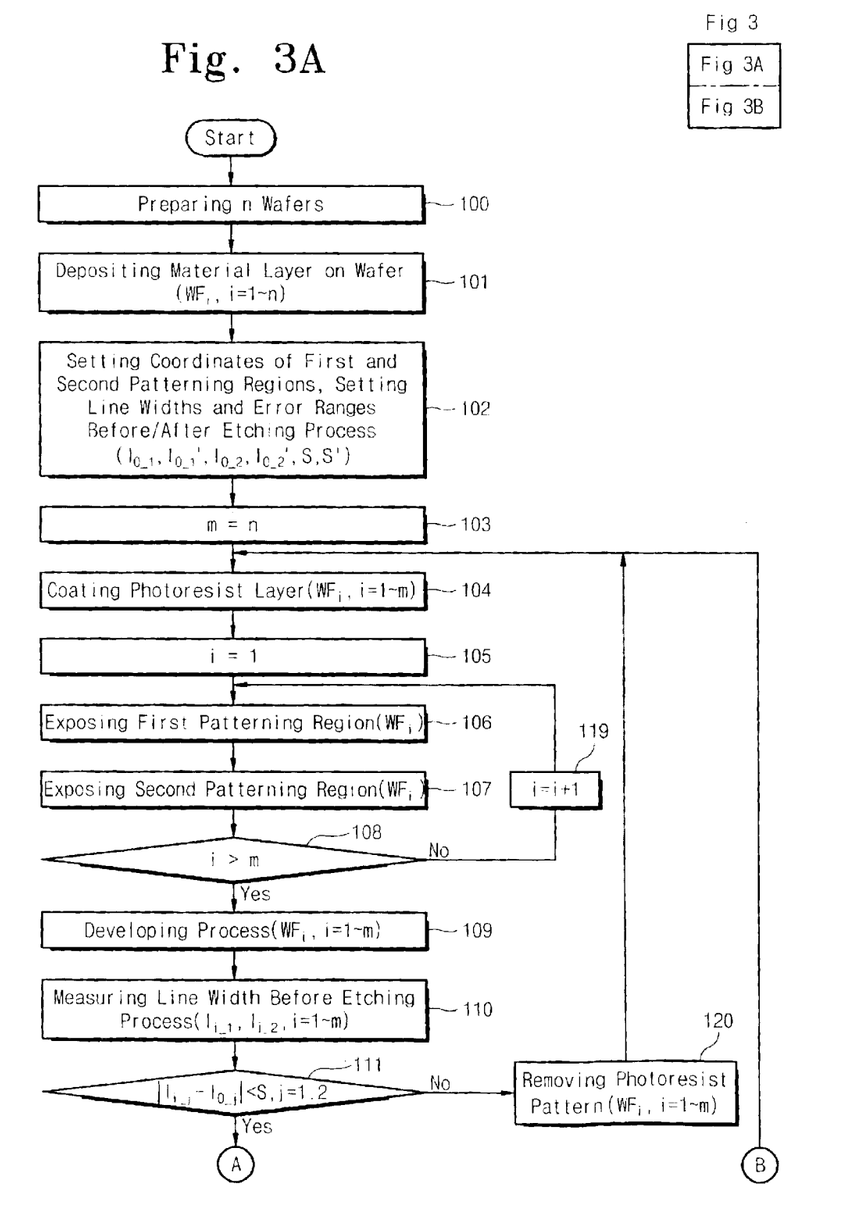
FIG. 3 is a process flowchart illustrating a patterning method for fabricating a semiconductor device according to a first preferred embodiment of the present invention.
Figure 3B:
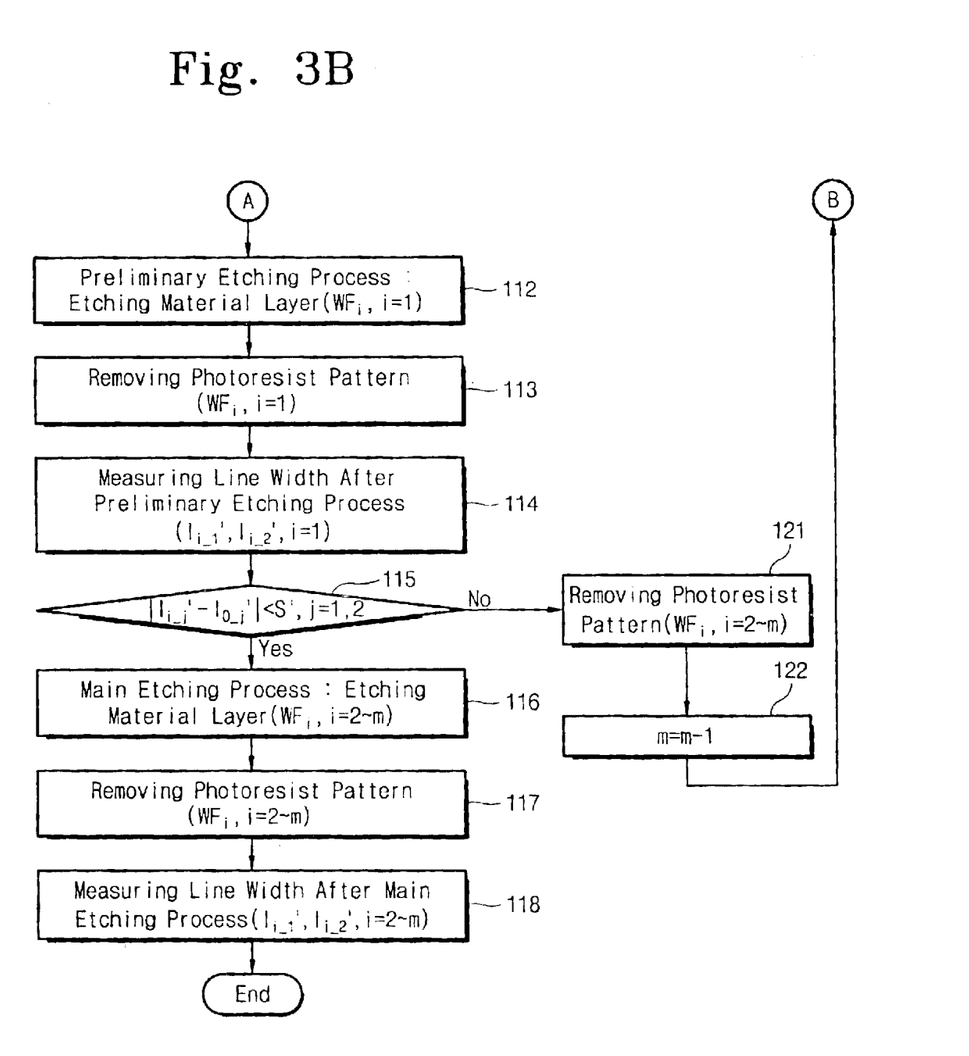

FIG. 3 is a process flowchart illustrating a patterning method for fabricating a semiconductor device according to a preferred embodiment of the present invention.

Referring to FIG. 3, a plurality of wafers ($WF_i$, i=1~n) are prepared (100), wherein each wafer comprises a plurality of independent patterning regions. The patterning regions are independent, that is, the patterning regions do not overlap each other and each wafer may be defined by the sum of the patterning regions.

The number of the patterning regions is equal to that of photolithographic processes needed for preventing deterioration due to process deviation in the same step. In view of the current technical status, the number of the patterning regions is preferably two (2), but may be increased for higher integration semiconductors. An example of the wafers having first and second independent patterning regions will be explained hereinafter. However, even when three or more independent patterning regions are defined, the present invention may be embodied according to the following descriptions.

Positions of the first and second patterning regions are preferably determined according to a process deviation of a line width caused by an ordinary patterning process, a process deviation of a thermal process, and a process deviation of an ion implantation process.

A material layer is deposited on the wafers (101). The material layer may be, for example, a gate conductive layer for a gate electrode of a semiconductor device, a metal layer for fabricating interconnections, or an interlayer dielectric (ILD) where a contact hole is formed.

Process conditions for patterning the material layer are set (102). The process conditions may be set in a prior step. The process conditions include coordinates for determining positions of the first and second patterning regions, a target line width ($1_{0\_1}$, $1_{0\_2}$) of a photoresist pattern formed on each patterning region, and target line width ($1_{0\_1}$, $1_{0\_2}$) of a material pattern. Further, a condition of an error range (S, S') of a line width is set. The error range (S, S') of a line width indicates a variable for determining whether a difference between an actual line width and the target line width is within a permissible range. The target line widths ($1_{0\_1}$, $1_{0\_2}$, $1'_{0\_1}$, and $1'_{0\_2}$) may be different between the first and second patterning regions. The differences ($1_{0\_1}-1'_{0\_1}$, $1_{0\_2}-1'_{0\_2}$) are determined according to problems generated by applying an ordinary process.

A photoresist layer is formed on the wafers where the material layer is deposited (103, 104).

One of the wafers is selected (105), and after exposing the photoresist layer of the first patterning region (106) of the selected wafer, the photoresist layer of the second patterning region is exposed (107). The two exposure processes (106, 107) are applied to different regions of the identical photoresist layer. Likewise, the process of exposing a photoresist layer of first and second patterning regions is applied to the rest of the wafers (108, 109).

The process of exposing the first and second patterning regions (106, 107) may be performed using different reticles. The reticles applied respectively for the exposure processes (106, 107) of the first and second patterning regions preferably have different line widths and circuit patterns of the same design. At this time, the reticles are preferably formed such that differences of the line widths of the reticles correspond to the foregoing differences ($1_{0\_1}-1'_{0\_1}$, $1_{0\_2}-1'_{0\_2}$) of the first and second patterning regions.

Also, the processes (106, 107) of exposing the first and second patterning regions may be conducted under different exposure conditions. At this time, the different exposure conditions are preferably different exposure times.

The exposed wafers are developed to form a photoresist pattern (109). The line widths ($1_{i\_1}$, $1_{i\_2}$) of the photoresist pattern are measured at each of the first and second patterning regions (110). The step of measuring the line widths (110) may be applied to an entire wafer or a portion of a wafer.

A difference between the measured line width ($1_{i\_1}$, $1_{i\_2}$) and the target line width ($1_{0\_1}$, $1_{0\_2}$) of the photoresist pattern is within the error range (S) is determined (111) at the first and second patterning regions. In the case that the measured line width ($1_{i\_1}$, $1_{i\_2}$) of the photoresist pattern departs from the error range (S±$1_{0\_j}$, j=1, 2) of the line width, the photoresist layer covering the entire wafer is removed (120).

Inversely, if the measured line width ($1_{i\_1}$, $1_{i\_2}$) is within the error range (S±$1_{0\_j}$, j=1, 2) of the line width, one of the wafers is selected to undergo a preliminary etching process (112). According to the preliminary etching process (112), the material layer is etched using the photoresist pattern as an etch mask to form a material pattern.

The preliminary etching process (112) is carried out to prevent deterioration of the entire wafer when process conditions of the etching process are not appropriate. The preliminary etching process may be applied to a plurality of wafers. That is, the foregoing exposure process also adopts a method of evaluating whether process conditions are proper by using a portion of the wafers.

The photoresist pattern is removed from the wafer where the preliminary etching process is performed, thereby uncovering the material pattern 113. Next, the line widths ($1'_{i\_1}$, $1'_{i\_2}$) of the uncovered material pattern are measured at the first and second patterning regions (114).

The inspection step 115 is performed to determine whether a difference ($1'_{i\_j}-1'_{i\_j}$, j=1, 2) between the measured line width ($1'_{i\_1}$, $1'_{i\_2}$) and the target line width ($1'_{0\_1}$, $1'_{0\_2}$) of the photoresist pattern is within the error range (S').

In the case that the measured line width ($1'_{i\_1}$, $1'_{i\_2}$) of the photoresist pattern departs from the error range (S') of the line width, the photoresist layer covering the entire wafer is removed (121). Thereafter, process steps starting from the step (104) of coating the photoresist layer are repeatedly applied to the rest of the wafers, excluding the wafer where the preliminary etching process is performed (122). The rework steps may start from the preliminary etching process (112). In this case, the step (121) of removing the photoresist pattern is omitted.

Inversely, if the measured line width ($1'_{i\_1}$, $1'_{i\_2}$) is within the error range (S') of the line width, a main etching process is applied to the rest of the wafers (116). The main etching process is preferably performed under the same process conditions as the preliminary etching process (112). However, the main etching process (116) may employ an adjusted etch recipe by considering results of the preliminary etching process (112). The material layer stacked on the rest of the wafers during the main etching process (116) is etched to form a material pattern.

The photoresist pattern is removed from the wafers where the main etching process (116) is applied, thereby uncovering the material pattern (117). Thereafter, the line width ($1'_{i\_1}$, $1'_{i\_2}$) of the uncovered material pattern is measured at the first and second patterning regions (118).

Figure 4A:
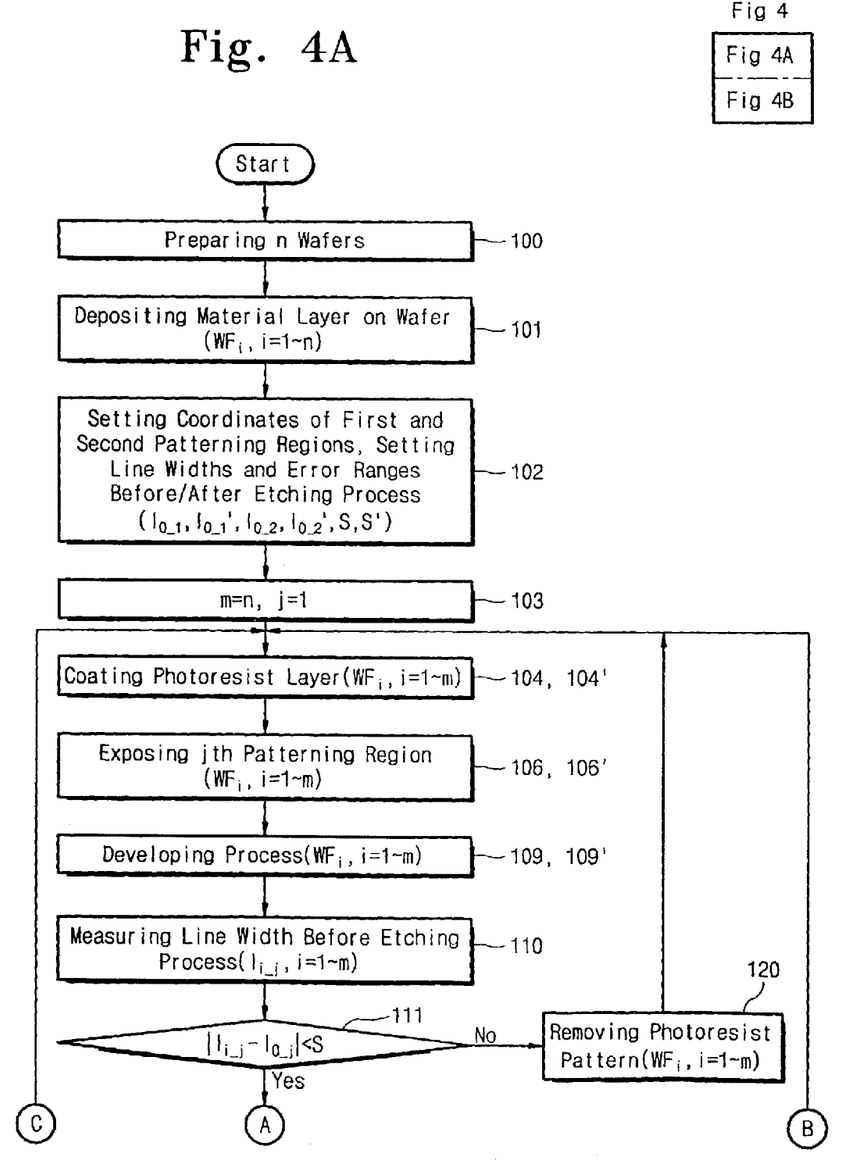
FIG. 4 is a process flowchart illustrating a patterning method for fabricating a semiconductor device according to a second preferred embodiment of the present invention.
Figure 4B:
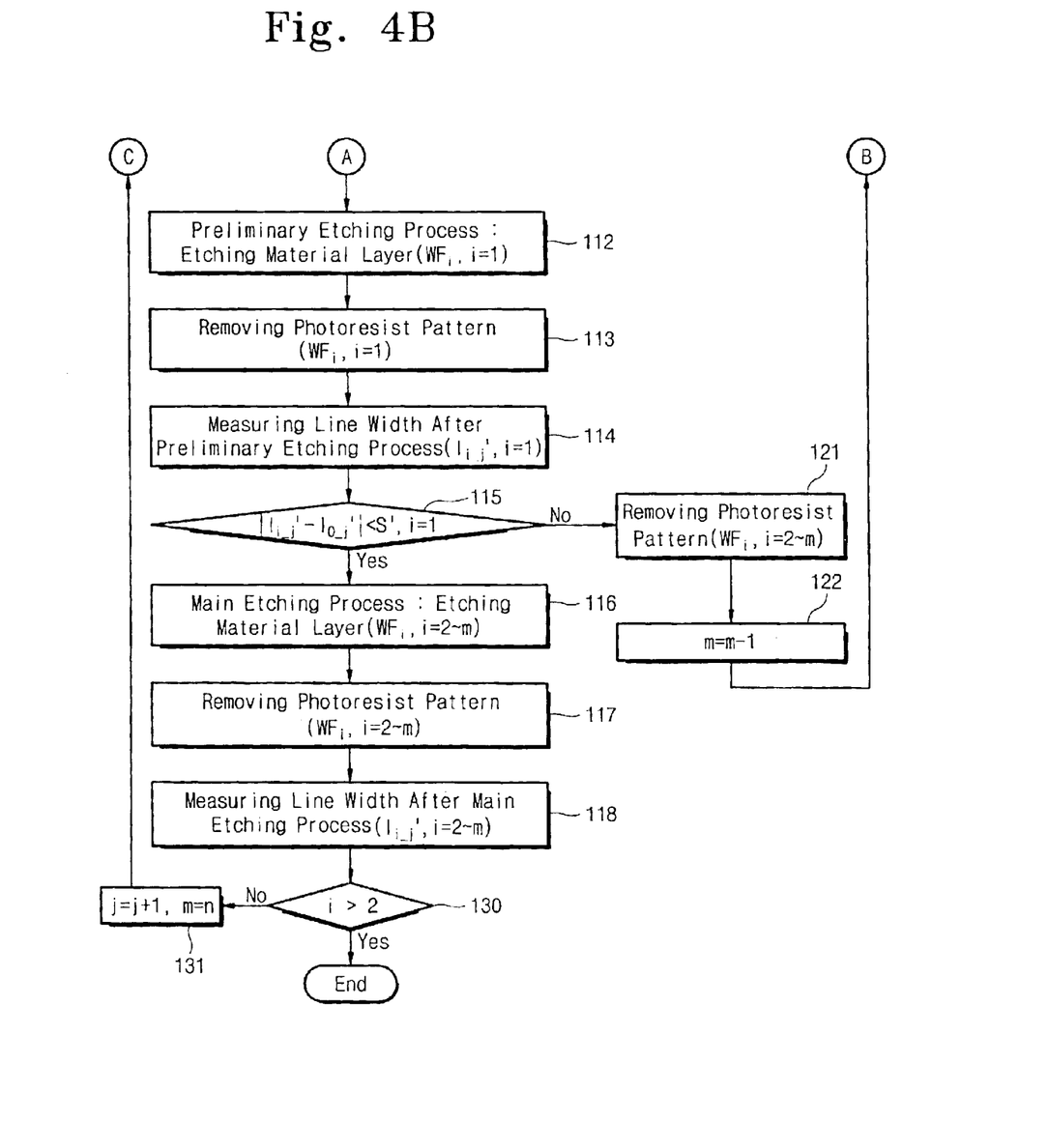

FIG. 4 is a process flowchart illustrating a patterning method for fabricating a semiconductor device according to an embodiment of the present invention. The embodiment described with respect to FIG. 4 is generally identical to the embodiment described with respect to FIG. 3. Thus, while descriptions of the same process steps will be omitted or simplified, different process steps will be explained in detail.

Referring to FIG. 4, a plurality of wafers ($WF_i$, i=1~n) are prepared (100), each of which has first and second independent patterning regions. A material layer is deposited on the wafers (101). Process conditions for patterning the material layer are set (102). The process steps (100, 101, and 102) are preferably performed in the same manner as described with respect to FIG. 3.

Thereafter, a first photoresist layer is formed on the wafers where the material layer is deposited (103, 104). After exposing the first photoresist layer at the first patterning region, the exposed first photoresist layer is developed to form a first photoresist pattern (106, 109). The first photoresist pattern has an opening that uncovers the material layer at the first patterning region and covers an entire surface of the second patterning region. For this, the exposure process is not conducted at the second patterning region.

A step of measuring a line width of the first photoresist pattern and the resultant rework process (111, 120) are carried out in the same manner as the first embodiment as illustrated in FIG. 3. At this time, the steps of measuring the line width and comparing the measurements (110, 111) are applied only to the first patterning region of the first photoresist pattern. A series of etching processes as described in FIG. 3 are performed (112 to 118, 121, and 122). In a series of the etching processes, the material layer is etched using the first photoresist pattern as an etch mask (112, 116), thereby forming a first material pattern.

The first material pattern is a resultant structure obtained by patterning the material layer only at the first patterning region. That is, the first material pattern remains unetched at the second patterning region. For this, as mentioned above, the exposure process 106 is applied only to the first patterning region.

A second photoresist layer is formed on the wafers including the first material pattern (104'). After exposing the second photoresist layer at the second patterning region (106'), the resultant structure is developed to form a second photoresist pattern (109'). The process steps (104', 106', and 109') are preferably performed by applying a series of the process steps (104, 106, and 109) for forming the first photoresist pattern. In this case, the exposure process (106') for forming the second patterning region is different from the exposure process (106) for forming the first photoresist pattern.

A series of etching processes are performed to etch the first material pattern using the second photoresist pattern as an etch mask. The first material pattern is etched to form a second material pattern. The etching processes for forming the second material pattern may be embodied by those (112 to 118, 121, and 122) for forming the first material pattern.

Also, like the first embodiment of FIG. 3, the exposure processes (106, 106') of the first and second patterning regions may employ different reticles. The reticles applied respectively to the exposure processes (106, 106') of the first and second patterning regions preferably have different line widths and circuit patterns of the same design. Further, the exposure processes (106, 106') may be conducted under different exposure conditions. At this time, the different exposure conditions are preferably different exposure times.

Meanwhile, unlike the embodiment described with respect to FIG. 3, in the second embodiment according to the present invention, the etching processes for forming the first and second material patterns may be performed using different etch recipes. At this time, the different etch recipes are preferably methods of using etch gases containing different components.

According to the present invention, a material pattern is formed using a patterning method, which is separately applied to a plurality of independent patterning regions and includes at least two steps of exposure processes. Thus, a material pattern of a different line width may be formed at each patterning region.

As a result, it is capable of effectively adjusting process deviations according to positions of wafers caused by a patterning process, a thermal process, and an ion implantation process.

An exposure process is separately applied to each patterning region, thereby minimizing rework processes of photolithographic and etching processes. Consequently, a production efficiency of semiconductor devices may be increased.

What is claimed is:

1. A patterning method for fabricating a semiconductor device, the method comprising:
   preparing a wafer having a plurality of independent patterning regions;
   forming a predetermined material layer on the wafer; and
   patterning the material layer to form a material pattern in each independent patterning region,
   wherein the material pattern of a first independent patterning region and the material pattern of a second independent patterning region have different line widths.

2. The method as claimed in claim 1, wherein patterning the material layer comprises a plurality of photolithographic processes, which are separately applied to each independent patterning region.

3. The method as claimed in claim 2, wherein the plurality of the photolithographic processes are applied to each independent patterning region using different reticles.

4. The method as claimed in claim 3, wherein the different reticles have different line widths and identical circuit pattern designs.

5. The method as claimed in claim 1, wherein pattering the material layer comprises a plurality of etching processes, which are separately applied to each patterning region.

6. The method as claimed in claim 5, wherein the plurality of the etching processes are applied to each independent patterning region using different etch recipes.

7. A patterning method for fabricating a semiconductor device, the method comprising:
   preparing a wafer having a first patterning region and a second patterning region;
   forming a predetermined material layer on the wafer;
   forming a photoresist layer on the material layer;
   exposing the first patterning region of the photoresist layer;
   exposing the second patterning region of the photoresist layer;
   developing the photoresist layer wherein a photoresist pattern is formed uncovering the material layer at a predetermined region;
   etching the uncovered material layer using the photoresist pattern as an etch mask to form a material pattern; and
   removing the photoresist pattern to uncover the material pattern,
   wherein the material pattern has different line widths in the first patterning region and the second patterning region.

8. The method as claimed in claim 7, wherein the first patterning region and the second pattering region are different from each other.

9. The method as claimed in claim 7, wherein the steps of exposing the first patterning region of the photoresist layer and exposing the second patterning region of the photoresist layer are respectively performed under different exposure conditions.

10. The method as claimed in claim 7, wherein the steps of exposing the first patterning region of the photoresist layer and exposing the second patterning region of the photoresist layer are respectively performed by applying different exposure times.

11. The method as claimed in claim 7, wherein the steps of exposing the first patterning region of the photoresist layer and exposing the second patterning region of the photoresist layer are respectively performed using different reticles.

12. The method as claimed in claim 11, wherein the reticles have different line widths and identical circuit pattern designs.

13. A patterning method for fabricating a semiconductor device, the method comprising:
   preparing a wafer having a first patterning region and a second patterning region;
   forming a predetermined material layer on the wafer;
   forming a first photoresist pattern on the material layer, the first photoresist pattern having an opening uncovering the material layer at the first patterning region;
   etching the uncovered material layer using the first photoresist pattern as an etch mask to form a first material pattern;
   removing the first photoresist pattern to uncover the first material pattern;
   forming a second photoresist pattern on the wafer where the first material pattern is uncovered, the second photoresist pattern having an opening uncovering the first material pattern at the second patterning region;

etching the uncovered first material pattern using the second photoresist pattern as an etch mask to form a second material pattern; and removing the second photoresist pattern to uncover the second material pattern, wherein the first material pattern and the second material pattern have different line widths.

14. The method as claimed in claim 13, wherein the first patterning region and the second patterning region are independent from each other.

15. The method as claimed in claim 13, wherein the first patterning pattern and the second photoresist pattern are formed under different exposure conditions.

16. The method as claimed in claim 13, wherein the first patterning pattern and the second photoresist pattern are formed by applying different exposure times.

17. The method as claimed in claim 13, wherein the first patterning pattern and the second photoresist pattern are formed using different reticles.

18. The method as claimed in claim 17, wherein the reticles have different line widths and identical circuit pattern designs.

19. The method as claimed in claim 13, wherein forming the first material pattern and the second material pattern are performed using different etch recipes.

20. The method as claimed in claim 13, wherein forming the first material pattern and the second material pattern uses etch gases containing different components.

21. The method as claimed in claim 13, wherein the first photoresist pattern is formed to cover an entire surface of the second patterning region.

22. The method as claimed in claim 13, wherein the second photoresist pattern is formed to cover an entire surface of the first patterning region.

\* \* \* \* \*